(12) United States Patent
Fogarty Cahir et al.

(10) Patent No.: US 12,113,059 B2
(45) Date of Patent: Oct. 8, 2024

(54) SEMICONDUCTOR DEVICE

(71) Applicant: Diodes Incorporated, Plano, TX (US)

(72) Inventors: Michael Fogarty Cahir, Oldham (GB); Stephen Geoffrey Badcock, Oldham (GB)

(73) Assignee: Diodes Incorporated, Plano, TX (US)

(*) Notice: Subject to any disclaimer, the term of this patent is extended or adjusted under 35 U.S.C. 154(b) by 49 days.

(21) Appl. No.: 18/147,935

(22) Filed: Dec. 29, 2022

(65) Prior Publication Data

US 2024/0021602 A1      Jan. 18, 2024

(30) Foreign Application Priority Data

Jul. 12, 2022  (EP) ..................................... 22184550

(51) Int. Cl.
*H01L 27/02*      (2006.01)
(52) U.S. Cl.
CPC ................................ *H01L 27/0259* (2013.01)
(58) Field of Classification Search
CPC ............. H01L 27/0259; H01L 29/8613; H01L 29/66098; H01L 29/66121; H01L 29/861; H01L 29/66136; H01L 29/66234; H01L 27/0664; H01L 27/0255; H01L 29/0821; H01L 23/535; H01L 29/0804; H01L 27/0248; H01L 29/7322; H01L 29/8611; H01L 29/0638; H01L 29/0649; H01L 29/732; H01L 29/1004; H01L 29/0692
See application file for complete search history.

(56) References Cited

U.S. PATENT DOCUMENTS

2012/0061792 A1   3/2012   Nozu
2013/0163139 A1   6/2013   Kashyap et al.
2014/0284659 A1   9/2014   Wei et al.
2019/0067269 A1   2/2019   Chen et al.
2022/0223580 A1*  7/2022   DiSarro ............. H01L 27/0262

FOREIGN PATENT DOCUMENTS

CN           111564439 A        8/2020

OTHER PUBLICATIONS

Extended European Search Report for European Application No. 22184550.6, mailed Jan. 12, 2023, 8 pages.

* cited by examiner

*Primary Examiner* — Wasiul Haider
(74) *Attorney, Agent, or Firm* — AP3 Law Firm PLLC; Hong Zou

(57) ABSTRACT

There is provided a semiconductor device and a method of manufacturing the same. The method comprises: depositing an epitaxial layer on a semiconductor substrate, wherein the semiconductor substrate is of a first conductivity type, and the epitaxial layer is of a second conductivity type that is opposite to the first conductivity type, wherein depositing the epitaxial layer comprises depositing a first epi-layer of a first doping concentration, a second epi-layer of a second doping concentration and a third epi-layer of a third doping concentration, and wherein the semiconductor substrate and the first epi-layer form a first P-N junction at their interface, and the second epi-layer is arranged between the first and third epi-layers and the second doping concentration is higher than each of the first doping concentration and the third doping concentration; and forming a doped region of the first conductivity type at a surface of the third epi-layer, such that the doped region 8 and the third epi-layer form a second P-N junction at their interface.

20 Claims, 8 Drawing Sheets

SEMICONDUCTOR DEVICE

TECHNICAL FIELD

This disclosure relates to a semiconductor device and a method of manufacturing the same. More particularly, but not exclusively, this disclosure relates to a bipolar junction transistor (BJT) based semiconductor device for use in electrostatic discharge (ESD) protection applications. The semiconductor device may also be referred to as an ESD protection device.

BACKGROUND

Over-voltage transients in the form of ESD can strike integrated circuit (IC) packages unexpectedly. Therefore, transient suppressing measures are often necessary to ensure normal functionality over the expected life span of the integrated circuits. ESD protection devices (also referred to as transient voltage suppressor (TVS) devices) are designed to absorb the damaging energy of transient strikes. As the transients are often manifested as fast, high voltage pulses, ESD protection devices are configured to force its internal semiconductor structure(s) into breakdown and thus divert the energy through these semiconductor structure(s) rather than through the protected integrated circuits.

It is known to use BJT based devices as ESD protection devices. BJT based ESD protection devices (referred to as "BJT-ESD devices" hereinafter) are desirable due to their high current driving capability. However, it is generally difficult to achieve high breakdown voltages (e.g., higher than ~10V) and shallow snapback performance, when vertical NPN or PNP BJT technology is used for ESD Protection devices.

FIG. 1 shows typical transmission line pulse (TLP) plots of a deep snapback ESD protection device A and a shallow snapback ESD protection device B. FIG. 1 is used here to simply explain the parameters of an ESD protection device in general. The X axis represents the voltage applied across an electrode pair of the device, and the Y axis represents the current flowing through the device. Device A has a trigger voltage $V_{TR-A}$, which is a maximum voltage for the device turns on (or triggers) and snaps back to a holding voltage $V_{H-A}$. Device B has a trigger voltage $V_{TR-B}$, which is on a similar level to $V_{TR-A}$, and a holding voltage $V_{H-B}$ which is significantly higher than $V_{H-A}$. For BJT-ESD devices, the X axis typically represent the collector-emitter voltage while the Y axis represents the collector current. The trigger voltage of a BJT-ESD device is generally associated with the breakdown voltage of the collector-base (CB) junction, and the holding voltage is generally associated with the breakdown voltage of the collector-emitter (CE) junction. A high trigger voltage is desired in certain applications. A shallow snapback is preferred to reduce the risk of latch-up which happens when the holding voltage of the ESD protection device is within the working voltage range of the integrated circuit being protected with a likelihood of the ESD protection device remaining in a conducting state after the over-voltage transients have passed.

Thus it is generally desirable to provide a BJT-ESD device which has a high breakdown voltage (e.g., a trigger voltage higher than ~10V) and shallow snapback performance. It is an object of this disclosure, among others, to provide such a semiconductor device.

SUMMARY

According to a first aspect of this disclosure there is provided a method of manufacturing a semiconductor device, comprising: depositing an epitaxial layer on a semiconductor substrate, wherein the semiconductor substrate is of a first conductivity type, and the epitaxial layer is of a second conductivity type that is opposite to the first conductivity type, wherein depositing the epitaxial layer comprises depositing a first epi-layer of a first doping concentration, a second epi-layer of a second doping concentration and a third epi-layer of a third doping concentration, and wherein: the semiconductor substrate and the first epi-layer form a first P-N junction at their interface; the second epi-layer is arranged between the first and third epi-layers; and the second doping concentration is higher than each of the first doping concentration and the third doping concentration; and forming a doped region of the first conductivity type at a surface of the third epi-layer, such that the doped region and the third epi-layer form a second P-N junction at their interface.

According to a second aspect of this disclosure, there is provided a semiconductor device, comprising: a semiconductor substrate of a first conductivity type; an epitaxial layer arranged on the semiconductor substrate, wherein: the epitaxial layer is of a second conductivity type that is opposite to the first conductivity type; the epitaxial layer comprises a first epi-layer of a first doping concentration, a second epi-layer of a second doping concentration and a third epi-layer of a third doping concentration, with the semiconductor substrate and the first epi-layer forming a first P-N junction at their interface; and the second epi-layer is arranged between the first and third epi-layers and the second doping concentration is higher than each of the first doping concentration and the third doping concentration; and a doped region arranged at a surface of the third epi-layer, wherein the doped region is of the first conductivity type such that the doped region and the third epi-layer form a second P-N junction at their interface; and wherein the first conductivity type is N type, and the second conductivity type is P type.

According to a third aspect of this disclosure, there is provided a semiconductor device, comprising: a semiconductor substrate of a first conductivity type; an epitaxial layer arranged on the semiconductor substrate, wherein: the epitaxial layer is of a second conductivity type that is opposite to the first conductivity type; the epitaxial layer comprises a first epi-layer of a first doping concentration, a second epi-layer of a second doping concentration and a third epi-layer of a third doping concentration, with the semiconductor substrate and the first epi-layer forming a first P-N junction at their interface; and the second epi-layer is arranged between the first and third epi-layers and the second doping concentration is higher than each of the first doping concentration and the third doping concentration; and a doped region arranged at a surface of the third epi-layer, wherein the doped region is of the first conductivity type such that the doped region and the third epi-layer form a second P-N junction at their interface, and wherein the doped region occupies less area than the third epi-layer along a plane that is parallel to a surface of the semiconductor substrate.

The isolation trench may comprise an electrically insulating material which lines a wall of the isolation trench and an electrically conductive material surrounded by the electrically insulating material. It would be understood that the electrically insulating material electrically isolates the electrically conductive material from the epitaxial layer and the semiconductor substrate.

Where appropriate any of the optional features described above in relation to one of the aspects of the disclosure may be applied to another one of the aspects of the disclosure.

BRIEF DESCRIPTION OF THE DRAWINGS

In order that the disclosure may be more fully understood, a number of embodiments of the disclosure will now be described, by way of example, with reference to the accompanying drawings, in which.

It will be appreciated that the drawings are for illustration purposes only and are not drawn to scale.

DETAILED DESCRIPTION OF THE PREFERRED EMBODIMENTS

Hereafter, referring to the attached drawings, a detailed description will be given of preferred embodiments of a semiconductor device according to the disclosure. A layer or region being prefixed by N or P in the description and attached drawings means that electrons or holes respectively are majority carriers. Also, '+' or '−' added to N or P indicates a higher impurity concentration or lower impurity concentration respectively than in a layer or region to which '+' or '−' is not added. Doped regions of the same relative doping concentration do not necessarily have the same absolute doping concentration. For example, two different 'N' doped regions may have the same or different absolute doping concentrations. In the following descriptions and attached drawings, the same reference signs are given to the same configurations, and redundant descriptions are omitted.

Figure 1:
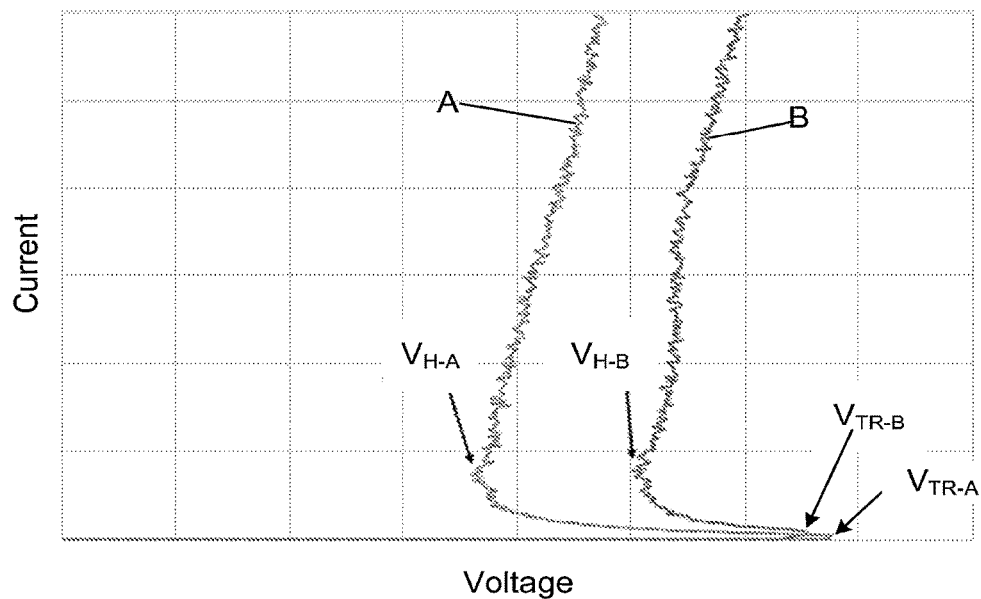
FIG. 1 is a diagram showing typical TLP plots of deep snapback and shallow snapback ESD protection devices.
Figure 2:
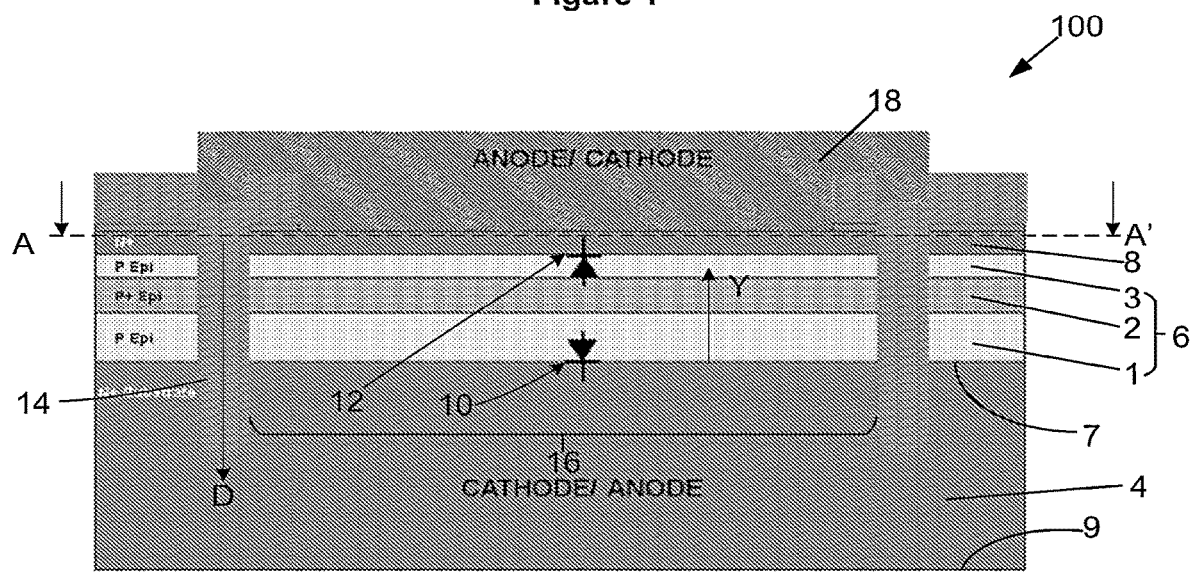
FIG. 2 is a schematic representation of a cross sectional view of a semiconductor device according to a first embodiment of this disclosure.

FIG. 2 schematically illustrates a cross-sectional view of a semiconductor device 100 according to a first embodiment of the disclosure. In the example provided by FIG. 2, the semiconductor device 100 is embodied as a vertical NPN BJT and can be used as a bi-directional ESD protection device. The semiconductor device 100 is formed on an N+ type semiconductor substrate 4 having a top surface 7 and an opposite bottom surface 9 which is generally parallel to the top surface 7. In this example, the semiconductor substrate 4 is made of silicon but other semiconductor materials such as silicon carbide, gallium nitride, gallium arsenide, etc. are also contemplated.

An epitaxial layer 6 is deposited on the top surface 7 and grows upwards along a vertical direction Y that is perpendicular to the top surface 7. In an example, the epitaxial layer 6 may be made by chemical vapour deposition which delivers precursors to the substrate 4 in gaseous state. The epitaxial layer 6 is doped to be P type in situ during the growth of the layer 6. For example, doping can be achieved by adding impurities (or dopants) to the source gas, and the concentration of dopants in the gas phase determines the concentration of dopants in the deposited epitaxial film. Therefore, by maintaining a constant concentration of dopants in the gas phase, the deposited epitaxial film achieves a substantially flat dopant profile. The epitaxial layer 6 may be made of the same semiconductor material (e.g., silicon) as the substrate 4. Alternatively, the epitaxial layer 6 and the substrate 4 may be based upon different semiconductor materials.

Figure 5:
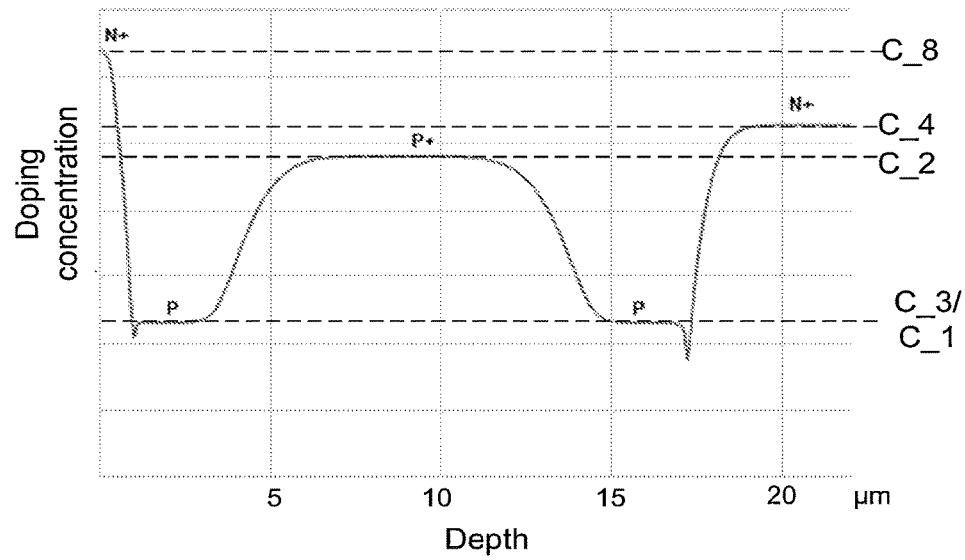
FIG. 5 schematically shows a dopant profile of the device of FIG. 2.
Figure 6:
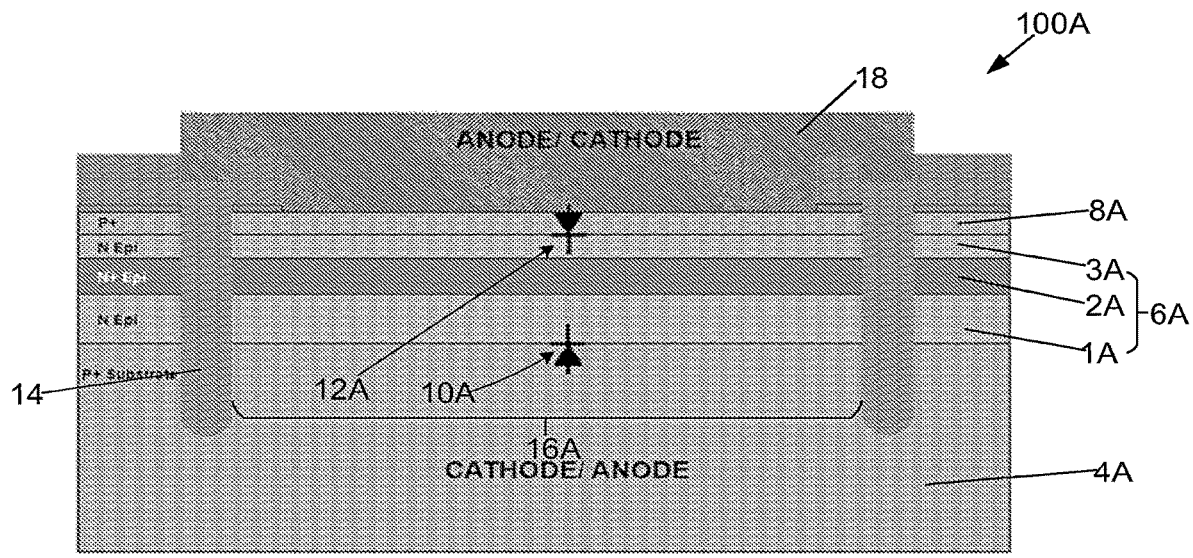
FIG. 6 is a schematic representation of a cross sectional view of a semiconductor device according to a second embodiment of the disclosure.

With reference to FIGS. 2 and 5, the epitaxial layer 6 comprises layers having different doping levels, i.e., a first P type epi-layer 1 with a doping concentration $C\_1$, a second P+ type epi-layer 2 with a doping concentration $C\_2$, and a third P type epi-layer 3 with a doping concentration $C\_3$. The varying doping concentrations may be achieved by adjusting the concentration of dopants in the gas phase of precursors during the epitaxial process.

The epi-layers 1 to 3 are stacked along the Y direction, and each has the same surface area as the substrate 4. The second P+ type epi-layer 2 is arranged between the first and third epi-layers 1 and 3, and has a higher doping concentration than epi-layers 1 and 3. A P-N junction 10 is formed at the interface between the substrate 4 and the first epi-layer 1.

An N+ type doped region 8 is formed at a surface of the third epi-layer 3. The N+ type doped region 8 may be created by implanting N type dopants such as Phosphorus or Arsenic into part of the P type epi-layer 3 followed by an annealing step and thus forms a P-N junction 12 with the remaining part of the epi-layer 3. The doped region 8 is more heavily doped with N type dopants to overcome the original P type doping concentration of the third epi-layer 3. Alternatively, the N+ type doped region 8 may be formed by a N type dopant deposition step on the surface of the third epi-layer 3 followed by a drive-in step which allows the N type dopants to thermally diffuse into the P type epi-layer 3. In another example, the N+ type doped region 8 may be formed by depositing an N type epitaxial layer on the top surface of the third epi-layer 3. The N type epitaxial layer may be further implanted or diffused with N type dopants to adjust its doping concentration.

With the two P-N junctions 10, 12, the N+ type doped region 8, the epitaxial layer 6 and the substrate 4 therefore form a vertical BJT structure. The epitaxial layer 6 is the base of the BJT. Depending upon the polarity of voltages applied across the semiconductor device 100, one of the N+ type doped region 8 and the substrate 4 acts as the emitter, with the other acting as the collector of the BJT.

In the example of FIG. 2, the N+ type doped region 8 forms a layer which occupies the same surface area as the third epi-layer 3 along a plane parallel to the surfaces 7, 9 of the substrate 4. This type of doped region 8 can be formed by blanket surface doping, without requiring any mask. Blanket surface doping allows a planar P-N junction 12 to be formed at the interface between the N+ type doped region 8 and the third epi-layer 3.

Figure 3:
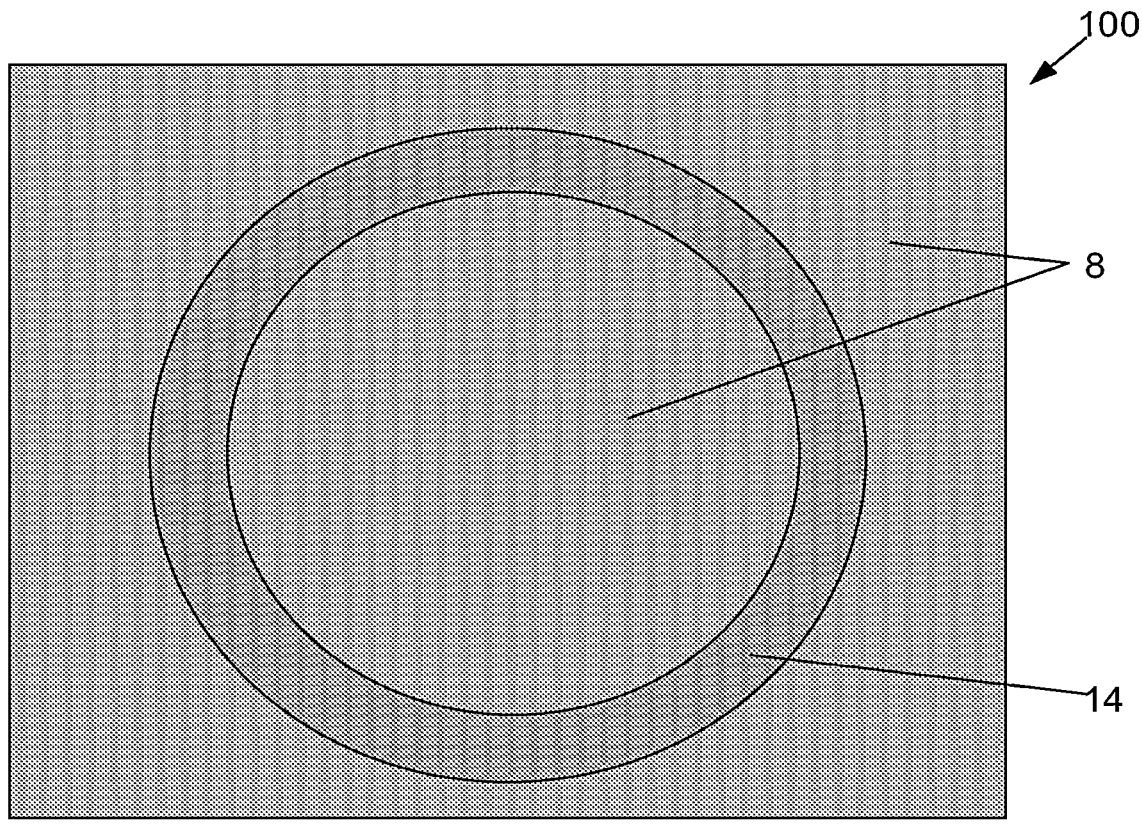
FIG. 3 is a schematic representation of a top plan view of the device of FIG. 2 when the device is cut along line A-A' of FIG. 2.
Figure 4:
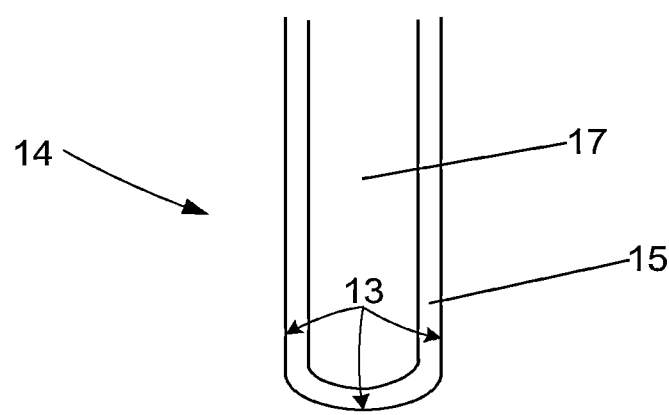
FIG. 4 is schematic representation of a cross sectional view of a trench used in the device of FIG. 2.

With reference to FIGS. 2 to 4, the semiconductor device 100 further comprises an isolation trench 14. The isolation trench 14 is etched from a top surface of the N+ type doped region 8, through the epitaxial layer 6, into the substrate 4. In an example as shown in FIG. 4, the walls 13 (including both the sidewalls and the bottom wall) of the trench 14 are first lined with an electrically insulating material 15 (such as silicon dioxide or nitride), and the trench is then filled with an electrically conductive material 17 (such as doped polysilicon or metal, e.g., tungsten). The electrically insulating material 15 surrounds the electrically conductive material 17, and therefore electrically isolates the electrically conductive material 17 from the epitaxial layer 6 and the substrate 4. In an alternative example, the space surrounded by the walls 13 of the trench 14 is filled exclusively with an electrically insulating material (such as silicon dioxide).

The isolation trench 14 extends along a direction D (i.e., the etching direction). In this example, the direction D is perpendicular to the surface of the N+ type doped region 8, the epitaxial layer 6 or the substrate 4, and thus is anti-parallel to the Y direction. However, it would be understood that angular etch such that the trench 14 extending into the silicon chip at an angle other than 90 degrees with respect to the chip surfaces is also contemplated. Further as shown in FIG. 2, the tip of the isolation trench 14 penetrates well into the substrate 4. It would be appreciated that the depth of penetration (along the direction D) may be shorter so the isolation trench 14 terminates at the interface between the epitaxial layer 6 and the substrate 4.

FIG. 3 illustrates a top plan view of the isolation trench 14 when the semiconductor device 100 is cut along a line A-A' as shown in FIG. 2. The line A-A' extends horizontally through the N+ type doped region 8, and lies on a plane that is parallel to the surfaces 7, 9 of the substrate 4. As shown in FIG. 3, the isolation trench 14 has an annular cross-sectional shape. By way of example only, the inside diameter of the isolation trench 14 may be of the order of 150 μm, and the width of the isolation trench 14 may be of the order of 1.5 μm. In the three-dimensional sense, the isolation trench 14 is of a tubular shape fully enclosing a cylindrical column of semiconductor materials 16 (FIG. 2). The column of semiconductor materials 16 include part of the N+ type doped region 8, part of the epitaxial layer 6 and part of the substrate 4. In use, the column of semiconductor materials 16 forms the active region of the device 100 which absorbs ESD energy, and the isolation trench 14 electrically isolates the ESD energy from semiconductor structures outside of the isolation trench 14. It would be appreciated that the isolation trench 14 may take any suitable cross-sectional shape which is not limited to the annular shape as shown in FIG. 3. For example, the isolation trench 14 may assume a loop shape that is oval, rectangular, square, polygonal or non-geometrical, etc., as long as it forms a closed loop that is without a gap, when viewed along the direction D.

With further reference to FIG. 2, the semiconductor device 100 also includes an electrode 18 which is electrically connected with the N+ type doped region 8 in an area surrounded by the isolation trench 14. Although it is not shown in FIG. 2, the semiconductor device 100 also includes another electrode which is electrically connected with the bottom surface 9 of the semiconductor substrate 4. In use, ESD current flows into the semiconductor device 100 via one of the electrode pair and leaves the device 100 from the other of the electrode pair. The semiconductor device 100 of FIG. 2 is a bidirectional ESD protection device, meaning that it can absorb both positive and negative transients. The BJT formed by the device 100 adopts a base open design, because the epitaxial layer 6 is not shorted to either of the electrode pair of the device 100.

FIG. 5 shows an exemplary dopant profile of the semiconductor device 100. In an example, the doping concentration $C\_4$ of the substrate 4 may be $2 \times 10^{19}$ cm$^{-3}$; the doping concentration $C\_1$ of the first epi-layer 1 and the doping concentration $C\_3$ of the third epi-layer 3 may be $2 \times 10^{16}$ cm$^{-3}$; the doping concentration $C\_2$ of the second epi-layer 2 may be $8 \times 10^{18}$ cm$^{-3}$; and the maximum doping concentration $C\_8$ at the top surface of the N+ type doped region 8 may be around $2 \times 10^{20}$ cm$^{-3}$. It can be seen that the doping concentrations $C\_1$, $C\_2$ and $C\_3$ of the epi-layers 1 to 3 are largely flat, with gradual changes at the interface between the substrate 4 and the first epi-layer 1, and at the interfaces between the epi-layers 1 to 3 themselves. The gradual changes of doping concentration are primarily caused by autodoping, in which dopants are released from a substrate (on which an epitaxial layer grows) through solid-state diffusion or evaporation and is reincorporated into the growing epitaxial layer either by diffusion through the interface or through the gas. Autodoping decreases with the growth of an epitaxial layer. Once autodoping diminishes, the intentional doping of the epitaxy process predominates and the dopant profile becomes substantially flat. The substantially flat dopant profile of an epitaxial layer is visually distinguished from the Gaussian distribution dopant profile achieved by ion implantation or the dopant profile achieved by thermal diffusion where the doping concentration decreases monotonically from a surface.

In this example, the doping concentration $C\_1$ of the first epi-layer 1 is substantially the same as the doping concentration $C\_3$ of the third epi-layer 3. This arrangement is beneficial for a bi-directional ESD device (e.g., the device 100), because it improves the symmetry of the base region (i.e., the epitaxial layer 6) of the BJT, and allows the device 100 to achieve similar performances (in particular, similar collector-emitter junction breakdown voltages) when absorbing positive and negative transients.

The typical thickness of each of the first and third epi-layers 1, 3 is about 6 to 9 μm, and the typical thickness of the second epi-layer 2 is about 2 to 7 μm. However, it would be understood that these are just examples, and the thickness of the each epi-layer may be varied. In general, the combined thickness of the epi-layers 1 to 3 is preferably less than the depth of the isolation trench 14 (along the direction D). Further, in the event that the N+ type doping region 8 is made by ion implantation or diffusion into the surface of the third epi-layer 3, it may be preferable to make the third epi-layer 3 thicker than the first epi-layer 1 by around 0.5 to 1 μm, so as to account for the depth of the N+ type doping region 8 and ensure that the thickness of the remaining third epi-layer 3 is substantially the same as the first epi-layer 1.

As described above, when conventional vertical BJT devices are used as ESD protection devices, it is difficult to achieve high breakdown voltages (e.g., higher than ~10V) and shallow snapback performance. The inventor observed and recognised that the root cause of the difficulty is that a lightly doped base region of the BJT is required to achieve a high collector-base junction breakdown voltage (i.e., $BV_{CBO}$ or the trigger voltage); however, due to the limitation on the vertical thickness of the base region as set by the requirement for trench isolation, the thickness of the base region is not sufficiently wide enough to reduce the forward current gain (β) of the BJT for achieving a high collector-emitter breakdown voltage (i.e., $BV_{CEO}$ or $BV_{CES}$ depending upon whether the base is open or shorted). The collector-emitter breakdown voltage determines the holding voltage. Therefore, a high gain (i.e., β) causes a large difference (i.e., deep snapback) between the trigger voltage and the holding voltage.

The semiconductor device 100 addresses the problems encountered by conventional BJT-ESD devices by using an epitaxial layer 6, which is a stack of P/P+/P epi-layers in the example of FIG. 2, as the base region of the vertical BJT. More specifically, the lightly doped layers (i.e., the first and third epi-layers 1, 3) of the base region provides a high collector-base junction breakdown voltage (i.e., the trigger voltage). The particular level of the junction breakdown voltage can be adjusted by changing the doping concentration in the first and third epi-layers 1, 3. For example, a reduced doping concentration in the first and third epi-layers 1, 3 would cause a higher junction breakdown voltage. The heavily doped central layer (i.e., the second epi-layer 2) of the base region is useful for reducing the gain of the BJT, thereby allowing the BJT to have a shallow snapback performance. The gain of the BJT can be adjusted by changing the doping concentration and/or the thickness of the second epi-layer 2. For example, increasing the thickness and/or increasing the doping concentration of the second epi-layer 2 effectively reduce the gain of the BJT. This is particularly useful for NPN-based devices (e.g., the device 100), because the gain of an NPN is inherently higher than a PNP and it is generally considered more challenging to achieve the shallow snapback performance in NPN-based devices than in PNP-based devices. The use of the heavily doped P+ type second epi-layer 2 allows the gain of the NPN device 100 to be easily controlled, thereby producing a shallow snapback performance.

Therefore, by using a stack of P/P+/P layers as the base region of the BJT, the semiconductor device 100 is able to provide a high trigger voltage and a shallow snapback performance. The particular depth of the isolation trench 14 is no longer a limiting factor on the performance of the semiconductor device 100 as in conventional vertical BJT-ESD devices.

The use of the heavily doped central layer (i.e., the second epi-layer 2) in the base region provides further benefits. Higher doping concentration in the central layer produces a lower resistance structure, which is an important factor in creating an ESD protection device with a low dynamic resistance and a low clamping voltage. Further, when the isolation trench 14 is lined with an electrically insulating material 15 and then filled with an electrically conducting material 17 as in FIG. 4, a parasitic MOS structure is formed by the electrically conducting material 17 (gate), the electrically insulating material 15 (gate oxide) and the epitaxial layer 6 (body). The parasitic MOS structure may induce a vertical N type conducting channel (produced by inversion) adjacent to the sidewalls of the isolation trench 14 in the epitaxial layer 6. The vertical N type conducting channel is electrically connected between the N+ type doped region 8 and the substrate 4. Therefore, the device 100 may experience a leakage current which flows between the N+ type doped region 8 and the substrate 4 via the induced N type conducting channel. The heavily doped second epi-layer 2 is useful for reducing the leakage current, because it enhances the threshold voltage of the parasitic MOS structure for inducing the conductive channel.

Using epitaxy to produce the lightly and heavily doped layers of the base region (rather than other doping methods (e.g., ion implantation)) is advantageous in that epitaxy enables a greater control of the doping concentration and thickness in each layer and, in particular, allows for the creation of a thicker and more heavily doped central layer. Therefore, the performance of the semiconductor device 100 can be easily adjusted to suit different types of ESD applications, by adjusting parameters of the epitaxial deposition process.

The first to third epi-layers 1 to 3 may be produced in a single epitaxial process run. The different doping concentrations of the epi-layers 1 to 3 may be achieved by varying the concentration of dopants in the precursors during the epitaxial process. Such an epitaxial process may also be referred to as graded epitaxial deposition. Alternatively, the first to third epi-layers 1 to 3 may be produced by three separate epitaxial process runs.

Using epitaxy to create the first epi-layer 1 allows a planar P-N junction 10 to be formed at the interface between the first epi-layer 1 and the substrate 4 (e.g., between the base and collector of the vertical BJT). Further, as described above, the use of blanket surface doping (e.g., blanket ion implantation) allows a planar P-N junction 12 to be formed at the interface between the N+ type doped region 8 and the third epi-layer 3 (e.g., between the base and the emitter of the vertical BJT). Planar P-N junctions 10, 12 are free of weak spots which are commonly associated with non-planar cylindrical junctions (which may be created by masked doping methods), and generally break down at a higher voltage level than non-planar junctions. When a planar junction does breakdown, the entire junction area tends to breakdown simultaneously and the entire junction area spreads the breakdown current. Therefore, with the planar P-N junctions 12, the device 100 is able to absorb larger transient pulses than a device using non-planar cylindrical junctions.

The semiconductor device 100 may be manufactured using the following exemplary process which is in no way limiting. The process starts with the heavily doped N+ type substrate 4. Before the growth of the epitaxial layer 6, it is an option to implant N type dopants into the substrate 4, or to deposit a lightly doped N type thin epitaxial layer and then further implant N type dopants into the epitaxial layer. The epitaxial layer may have a final doping concentration which is higher or lower than the doping concentration of the original substrate 4. The purpose of this step is to modify the doping concentration at the surface 7 of the substrate 4, so as to modulate the junction breakdown at the interface between the substrate 4 and the epitaxial layer 6. However, this step is optional and can be entirely omitted. Further, the end product of this step may be considered as the starting substrate of the process. The process then proceeds to deposit the P type epitaxial layer 6 on the substrate 4. The epitaxial deposition is split into three separate steps to achieve light/heavy/light doping concentrations, thereby forming the P type first epi-layer 1, the P+ type second epi-layer 2 and the P type third epi-layer 3. Subsequently, N type dopants are implanted into the surface of the third epi-layer 3 to form the N+ type doped region 8. In the example of FIG. 2, the implantation is an unmasked blanket implantation.

The process then proceeds to mask and etch the N+ type doped region 8, through the epitaxial layer 6, into the substrate 4, thereby forming a trench. The trench is filled with an electrically insulating material such as silicon dioxide. The electrically insulating material may be used to line the trench walls 13 only, before an electrically conductive material 17 is filled into the remaining space of the trench. Alternatively, the trench may be filled exclusively with the electrically insulating material. This arrangement is preferred due to the reduced likelihood of leakage (which is caused by sidewall inversion of the parasitic MOS structure as described above) and allows greater flexibility to use blanket implantation for forming the N+ type doped region 8 without risking leakage. Subsequently, a contact dielectric layer is deposited, masked and etched. The surface of the N+ type doped region 8 that is uncovered by the contact dielectric layer may be masked and implanted with contact implants of either or both dopant species to reduce the contact resistance between metal-semiconductor junction if required. In the next step, metallization layers are deposited, masked and etched to form one terminal 18 on the top surface of the device 100 and another terminal (not shown in FIG. 2) on the back surface 9 of the substrate, thereby forming a vertical electrical circuit path through the device 100.

While FIG. 2 illustrates that the epitaxial layer 6 includes three epi-layers 1 to 3 only, it would be appreciated that additional epi-layer(s) may be formed between the epi-layers 1 and 2, and/or between the epi-layers 2 and 3, and that the additional epi-layer(s) may have a doping concentration which is between $C\_3$ and $C\_2$ or between $C\_1$ and $C\_2$. While FIG. 5 shows that $C\_3$ is equal to $C\_1$, it would be understood that it is not essential.

The semiconductor device 100 may be a stand-alone ESD protection chip, or may be incorporated into an integrated circuit to be protected. While the device 100 includes an isolation trench 14, it would be appreciated that the trench 14 may be omitted in certain applications.

FIGS. 6-14 schematically illustrate semiconductor devices 100A to 100G according to the second to eighth embodiments of the disclosure, respectively. Elements of the semiconductor devices 100A-100G that are identical to those of the semiconductor device 100 are identified using the same labels. Elements of the semiconductor devices 100A-100G that correspond to, but are different from those of the semiconductor device 100 are labelled using the same numerals but with a letter ('A' to 'G') for differentiation. The features and advantages described above with reference to the first embodiment are generally applicable to other embodiments.

Figure 7:
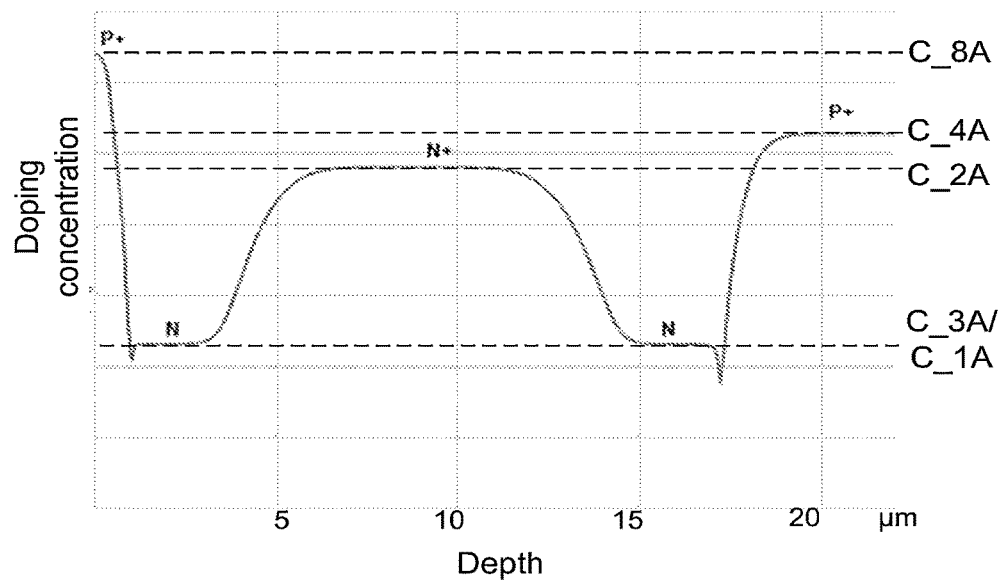
FIG. 7 schematically shows a dopant profile of the device of FIG. 6.

The semiconductor device 100A (FIG. 6) share the same structure as the semiconductor device 100, but with reversed doping polarities in the substrate 4A, each of the epi-layers 1A-3A and the doped region 8A as compared to their counterparts in the semiconductor device 100. Therefore, the semiconductor device 100A is a vertical PNP BJT and can be used as a bi-directional ESD protection device. FIG. 7 an exemplary dopant profile of the semiconductor device 100A, and the dopant profile is similar to the dopant profile shown in FIG. 5, but with reversed doping polarities.

Figure 8:
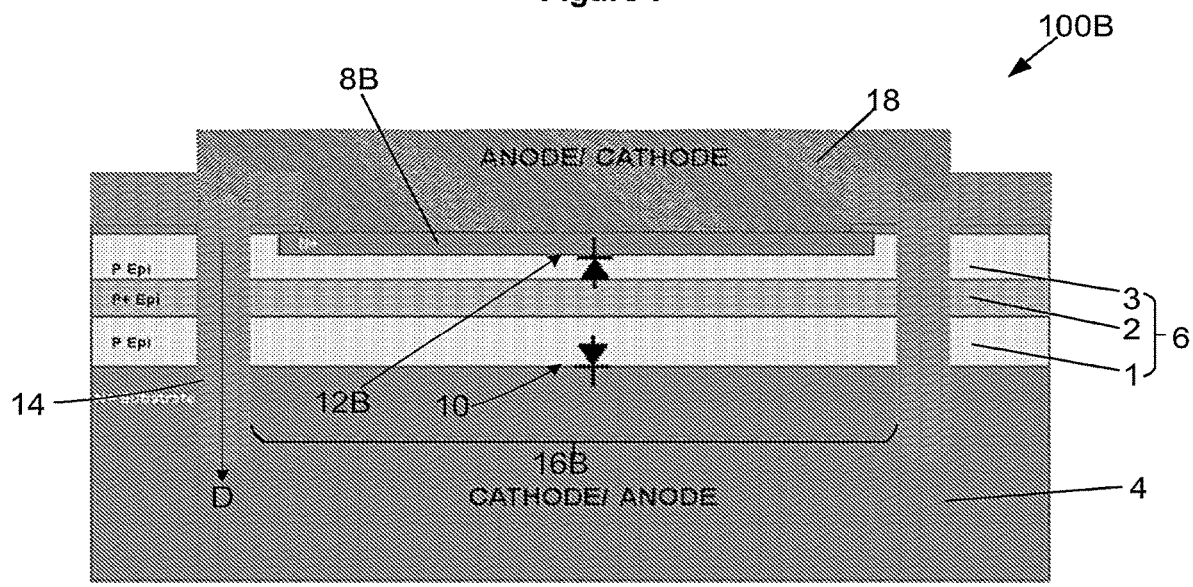
FIG. 8 is a schematic representation of a cross sectional view of a semiconductor device according to a third embodiment of the disclosure.
Figure 9:
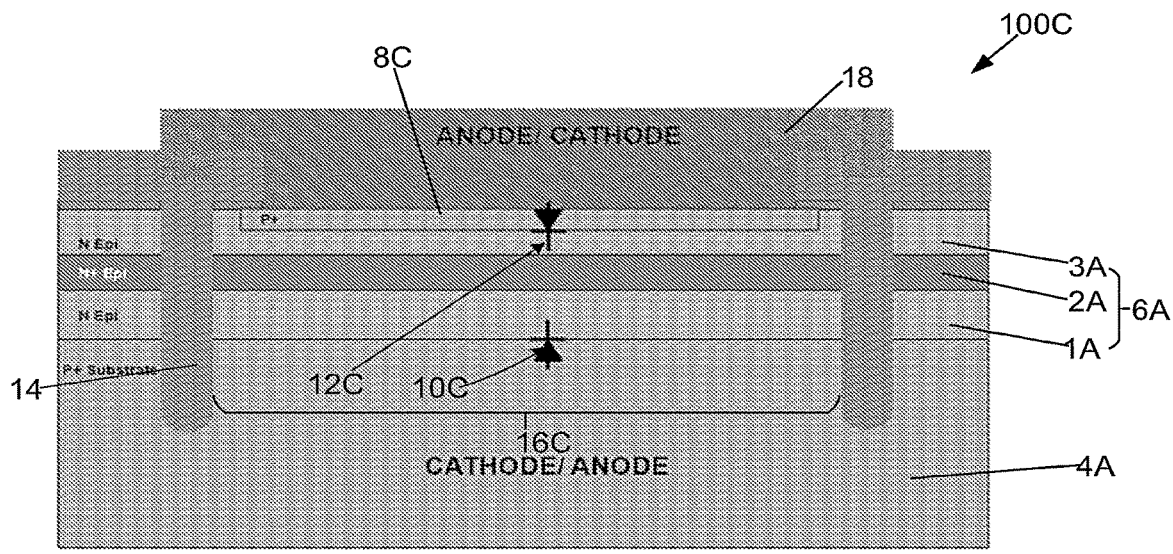
FIG. 9 is a schematic representation of a cross sectional view of a semiconductor device according to a fourth embodiment of the disclosure.

The semiconductor device 100B (FIG. 8) is a vertical NPN BJT and can be used as a bi-directional ESD protection device. The semiconductor device 100B differs from the semiconductor device 100 in that its N+ type doped region 8B is formed by masked surface doping methods (e.g., ion implantation or diffusion), rather than blanket doping methods. As shown in FIG. 8, the N+ type doped region 8B has a surface area which is less than that of the epitaxial layer 6 (in particular, the third epi-layer 3) or the semiconductor substrate 4. The N+ type doped region 8B is surrounded by the isolation trench 14, but does not contact the sidewalls of the isolation trench 14. In this way, the N+ type doped region 8B is not electrically connected to the inverted channel of the parasitic MOS structure (described above). Thus, there is no leakage path between the electrode pair of the device 100B. Accordingly, the semiconductor device 100B has a reduced leakage current. The disadvantage of the semiconductor device 100B is that the P-N junction 12B between the N+ type doped region 8B and the third epi-layer 3 becomes a non-planar cylindrical junction and comprises weak spots. The BJT of the semiconductor device 100B also adopts a base open design because the epitaxial layer (i.e., the base of the BJT) is not tied to any of the electrode pair of the device 100B.

The semiconductor device 100C (FIG. 9) share the same structure as the semiconductor device 100B, but with reversed doping polarities in the substrate 4A, each of the epi-layers 1A-3A and the doped region 8C as compared to their counterparts in the semiconductor device 100B. Therefore, the semiconductor device 100C is a vertical PNP BJT and can be used as a bi-directional ESD protection device.

The semiconductor device 100D (FIG. 10) is a uni-directional ESD protection device comprising an NPN BJT structure 22 (with a base open design) and a diode 10. The BJT structure 22 and the diode 10 are electrically connected in parallel between the electrode pair of the device 100D. Due to the presence of the diode 10, the semiconductor device 100D can only absorb unipolar transients with higher voltage potentials at the bottom electrode (not shown) connected to the substrate 4 than at the top electrode 18D.

Structure-wise, the semiconductor device 100D differs from the semiconductor device 100 in that its N+ type doped region 8D is loop shaped and formed by masked surface doping methods, and that it further comprises a P+ type doped region 20 and a second isolation trench 24, and that the top electrode 18D is electrically connected to each of the N+ type doped region 8D and the P+ type doped region 20. The P+ type doped region 20 is also formed by masked surface doping methods as described above.

Each of the isolation trenches 14, 24 extends along a depth direction D of the semiconductor device 100D. The isolation trench 24 may be formed simultaneously with the isolation trench 14. More specially, the trenches 14, 24 may be etched during the same etching process, and the trench 24 may be filled with the same material(s) as in the trench 14 during the same material deposition process. Further, the trenches 14, 24 are of the same depth along the etching direction D.

Figure 10:
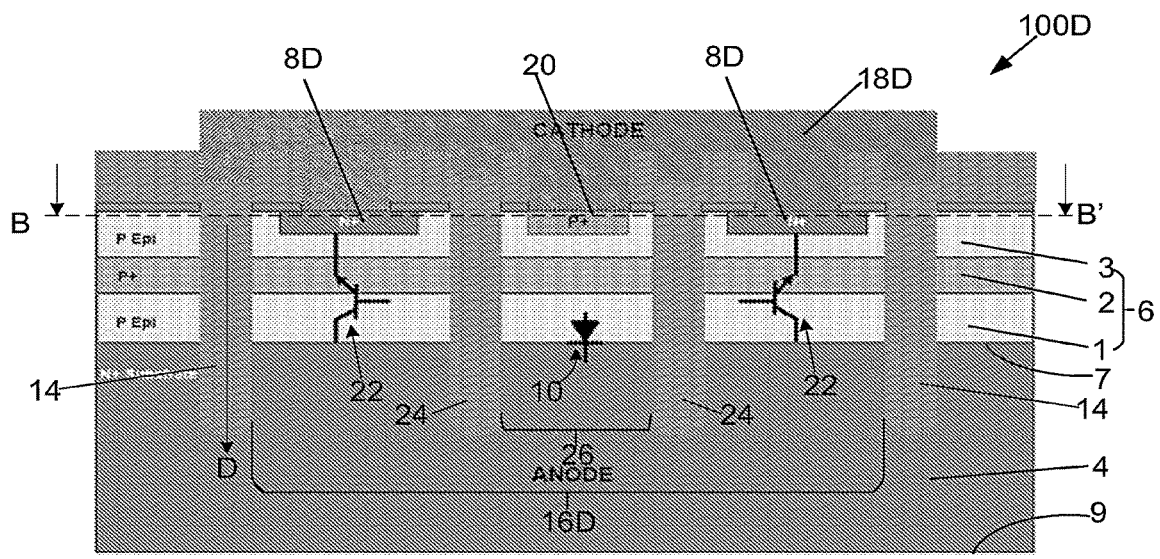
FIG. 10 is a schematic representation of a cross sectional view of a semiconductor device according to a fifth embodiment of the disclosure.
Figure 11:
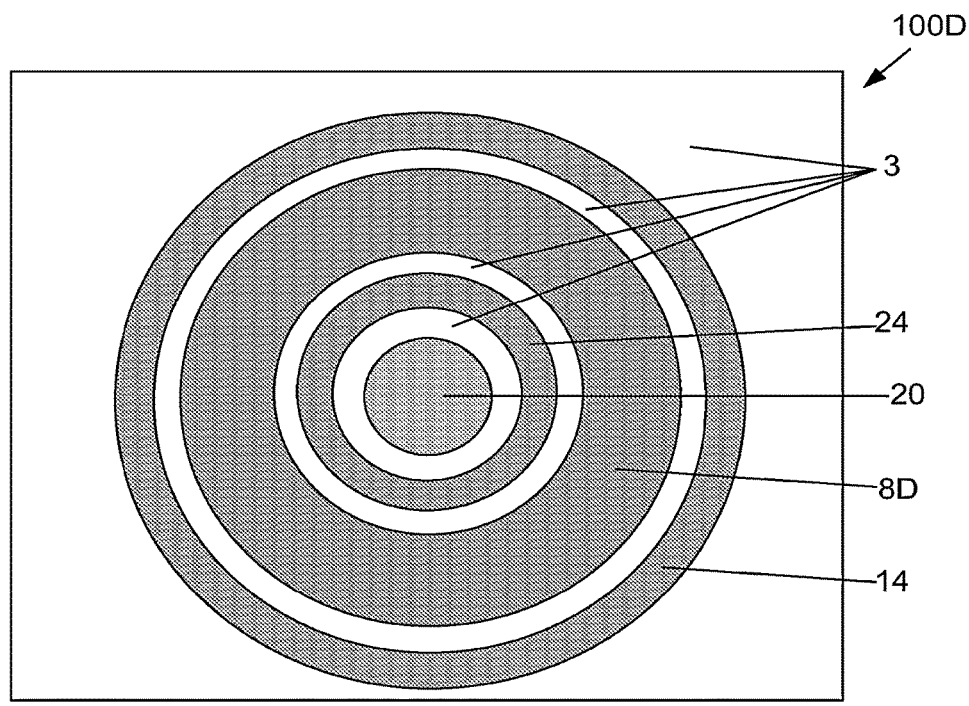
FIG. 11 is a schematic representation of a top plan view of the device of FIG. 10 when the device is cut along line B-B' of FIG. 10.
Figure 12:
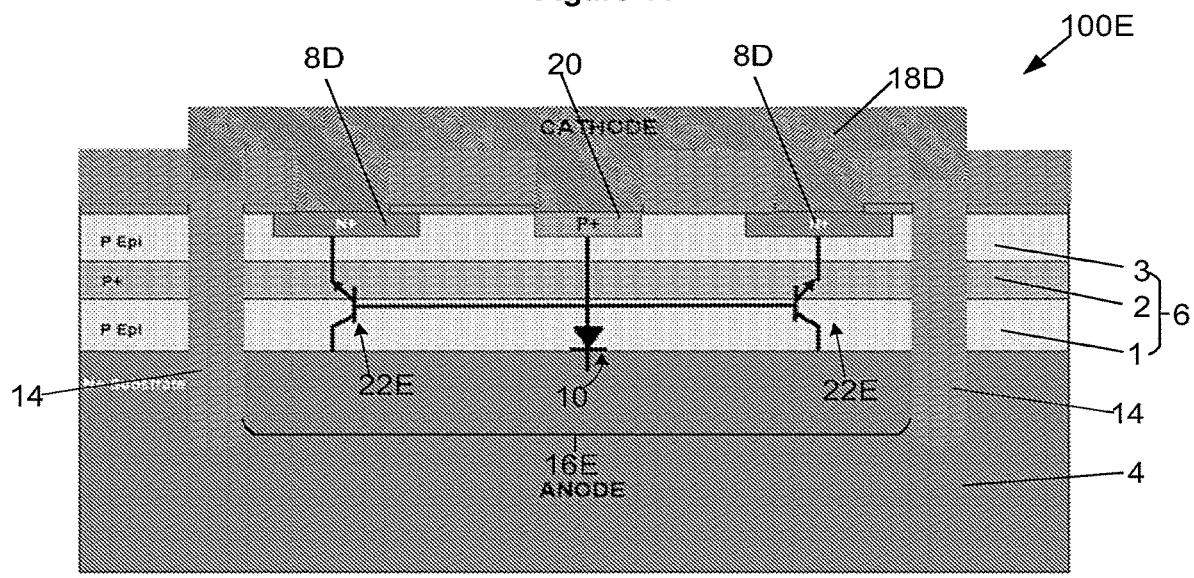
FIG. 12 is a schematic representation of a cross sectional view of a semiconductor device according to a sixth embodiment of the disclosure.
Figure 13:
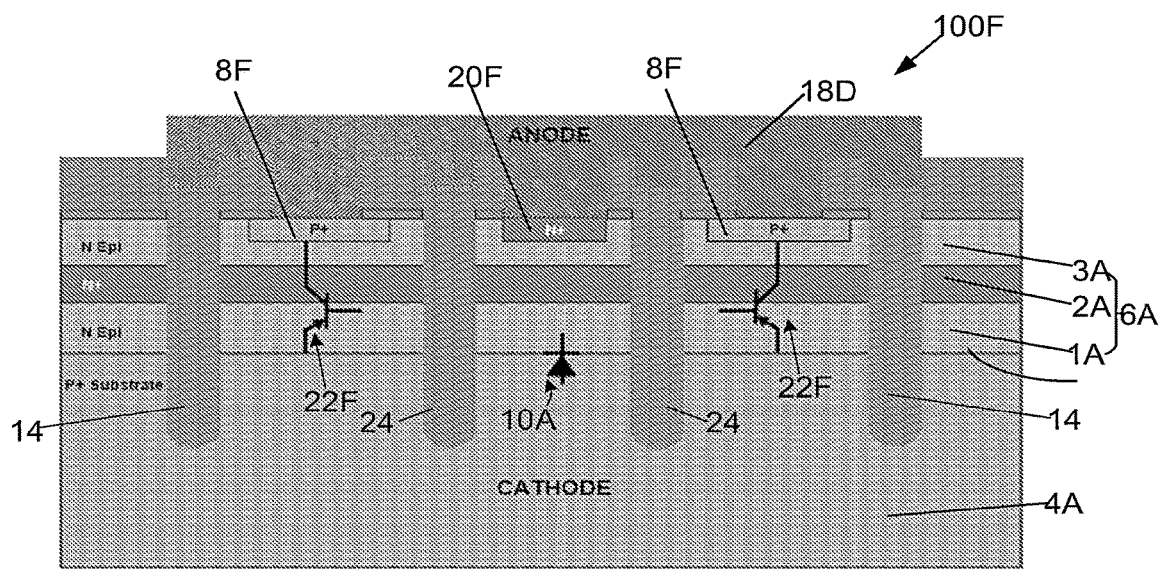
FIG. 13 is a schematic representation of a cross sectional view of a semiconductor device according to a seventh embodiment of the disclosure.
Figure 14:
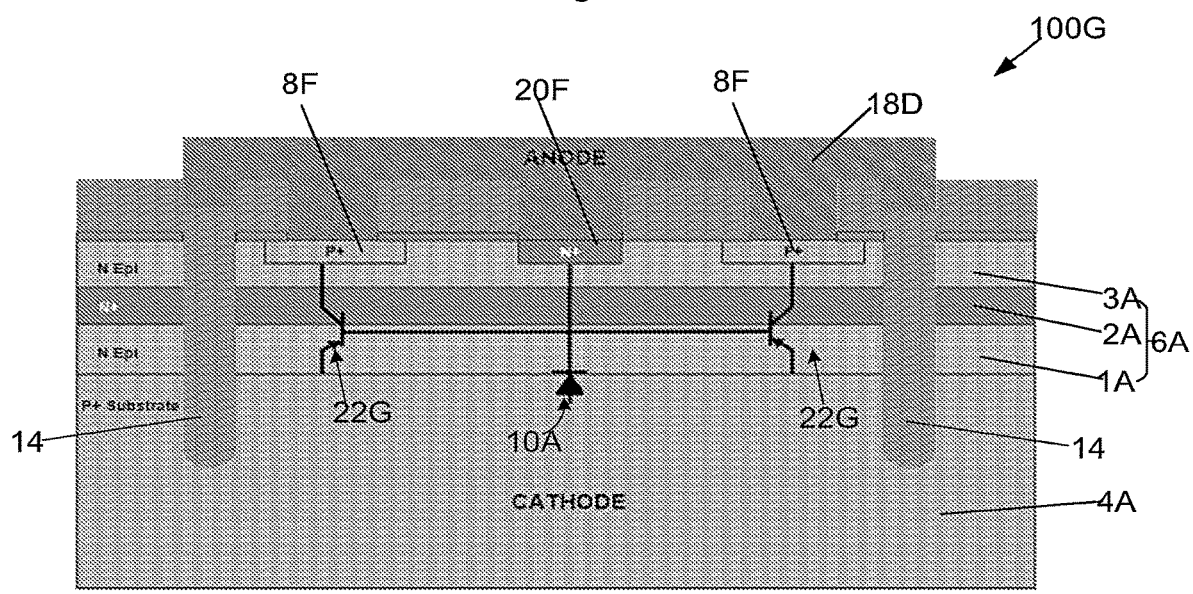
FIG. 14 is a schematic representation of a cross sectional view of a semiconductor device according to an eighth embodiment of the disclosure.

FIG. 11 illustrates a top plan view of the semiconductor device 100D when the device 100D is cut along a line B-B' as shown in FIG. 10. The line B-B' extends horizontally through the N+ type doped region 8D and the P+ type doped region 20, and lies on a plane that is parallel to the surfaces 7, 9 of the substrate 4. As shown in FIG. 11, each of the isolation trenches 14 and 24 is loop shaped (in particular, annular), with the isolation trench 14 completely surrounding the isolation trench 24. By way of example only, the inside diameters of the isolation trenches 14 and 24 may be of the order of 150 μm and 50 μm, respectively, and the width of each isolation trench 14, 24 may be of the order of 1.5 μm. In the three-dimensional sense, the isolation trench 14 is of a tubular shape fully enclosing a cylindrical column of semiconductor materials 16D, and the isolation trench 24 is of a similar tubular shape fully enclosing a smaller cylindrical column of semiconductor materials 26 (FIG. 10). The column of semiconductor materials 26 include the whole of the P+ type doped region 20, a small part of the epitaxial layer 6 and a small part of the substrate 4. The column of semiconductor materials 16D include the column of semiconductor materials 26, the isolation trench 24, the N+ type doped region 8D, and further parts of the epitaxial layer 6 and the substrate 4. The N+ type doped region 8D is arranged between the two isolation trenches 14, 24.

The N+ type doped region 8D forms the emitter of the BJT 22. The part of the epitaxial layer 6 arranged between the two isolation trenches 14, 24 forms the base of the BJT 22, and the N+ substrate 4 forms the collector of the BJT 22. The P+ type doped region 20 and the part of the epitaxial layer 6 enclosed by the isolation trench 24 collectively form the anode of the diode 10, with the N+ substrate 4 forming the cathode of the diode 10. The isolation trench 24 electrically isolates the base of the BJT 22 from the anode of the diode 10. In other words, the BJT 22 adopts a base open design, meaning that the base is not biased. As compared to a base shorted design, the base open design generally results in a lower capacitance between the electrode pair of the device 100D and therefore is more preferably for many ESD protection applications.

As shown in FIG. 10, the N+ type doped region 8D and the P+ type doped region 20 do not contact any of the vertical sidewalls of the isolation trenches 14, 24. In this way, the doped regions 8D, 20 are not electrically connected to the inverted channels of the parasitic MOS structures (which are formed when the trenches 14, 24 are filled with an insulating lining material and a conductive material as described above). The spaced-apart arrangement between the doped regions 8D, 20 and the isolation trenches 14, 24 therefore effectively reduces the leakage current of the device 100D.

In use, the BJT 22 dominates the absorption of ESD energy in the device 100D, and the breakdown voltage $BV_{CEO}$ of the collector-emitter junction of the BJT 22 determines the holding voltage of the device 100. The isolation trench 14 electrically isolates the ESD energy from semiconductor structures located outside of the isolation trench 14. It would be appreciated that the isolation trenches 14, 24 may take any suitable cross-sectional shape which is not limited to the annular shape as shown in FIG. 11. For example, one or more of the isolation trenches 14, 24 may assume a loop shape that is oval, rectangular, square, polygonal or non-geometrical, etc., as long as it forms a closed loop that is without a gap, when viewed along the direction D.

The semiconductor device 100E (FIG. 12) is a uni-directional ESD protection device comprising an NPN BJT structure 22E (with a base shorted design) and a diode 10. The BJT 22E and the diode 10 are electrically connected in parallel between the electrode pair of the device 100E. The semiconductor device 100E differs from the device 100D in that it does not have the inner isolation trench 24. Therefore, in the device 100E, the base (i.e., part of the epitaxial layer 6 surrounded by the trench 14) of the BJT 22E is shorted to the P+ type doped region 20 which is further connected to the cathode electrode 18D of the device 100E. The base shorted design causes the diode 10 to turn on earlier than the BJT 22E in ESD protection applications. As a consequence, the device 100E requires a higher trigger current than the device 100D. The semiconductor device 100E is identical to the device 100D on other aspects.

The semiconductor device 100F (FIG. 13) share the same structure as the semiconductor device 100D, but with reversed doping polarities in the substrate 4A, each of the epi-layers 1A-3A and the doped regions 8F, 20F as compared to their counterparts in the semiconductor device 100D. Therefore, the semiconductor device 100F is a vertical PNP BJT (with a base open design) and can be used as a uni-directional ESD protection device to absorb unipolar transients with higher voltage potentials at the top electrode 18D than at the bottom electrode (not shown) connected to the substrate 4A.

The semiconductor device 100G (FIG. 14) share the same structure as the semiconductor device 100E, but with reversed doping polarities in the substrate 4A, each of the epi-layers 1A-3A and the doped regions 8F, 20F as compared to their counterparts in the semiconductor device 100E. Therefore, the semiconductor device 100G is a vertical PNP BJT (with base shorted design) and can be used as a uni-directional ESD protection device to absorb unipolar transients with higher voltage potentials at the top electrode 18D than at the bottom electrode (not shown) connected to the substrate 4A.

Figure 15:
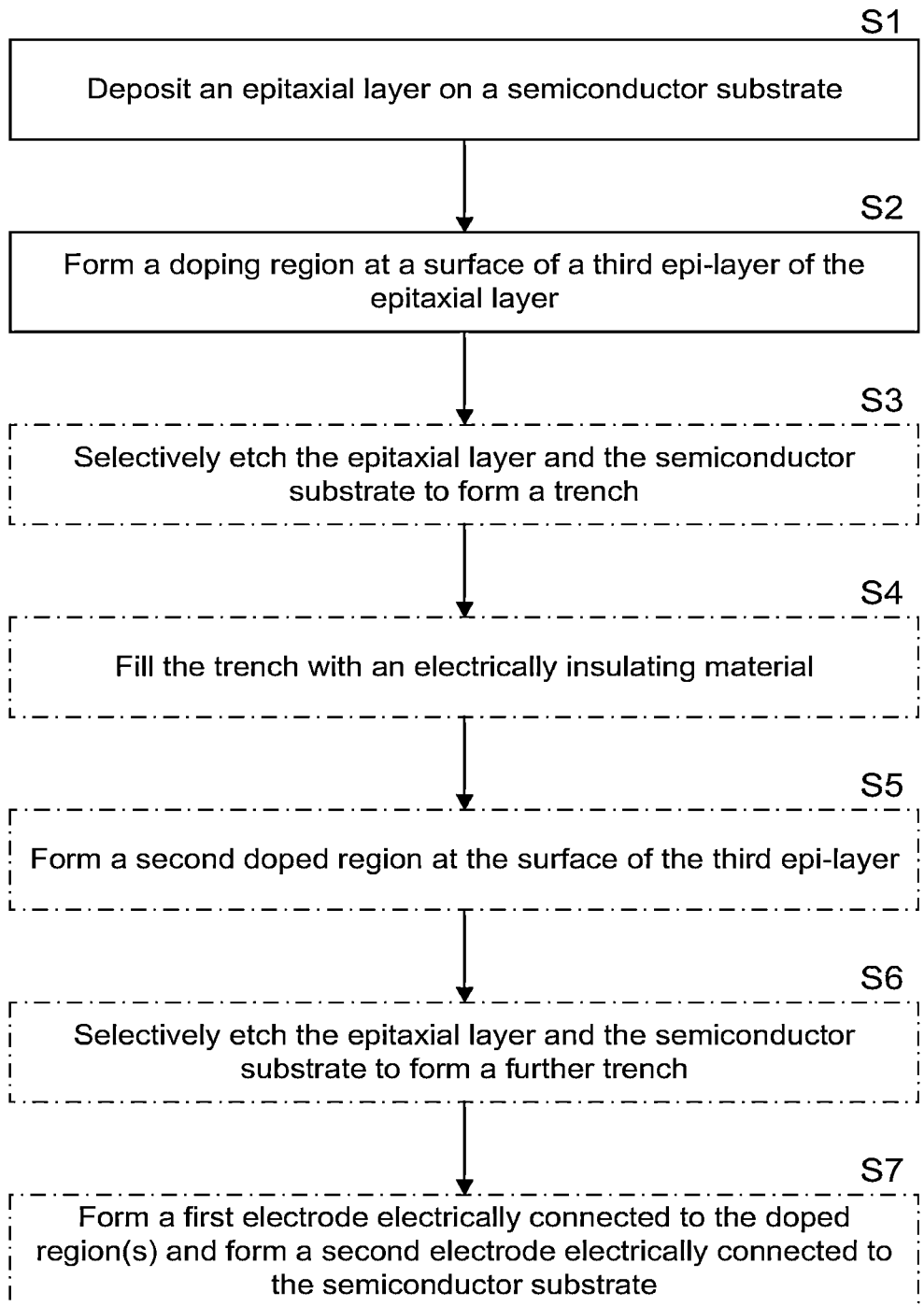
FIG. 15 schematically illustrates processing steps of a method for manufacturing a semiconductor device.

FIG. 15 schematically illustrates processing steps of a method for manufacturing a semiconductor device (e.g., any of the devices 100, 100A-100G).

At step S1, an epitaxial layer (e.g., the epitaxial layers 6, 6A) is deposited on a semiconductor substrate (e.g., the substrate 4, 4A). The semiconductor substrate is of a first conductivity type. The epitaxial layer is of a second conductivity type that is opposite to the first conductivity type. The first and second conductivity types are N type and P type, or vice versa.

Depositing the epitaxial layer comprises depositing a first epi-layer (e.g., the epi-layer 1, 1A) of a first doping concentration (e.g., C_1, C_1A), a second epi-layer (e.g., the epi-layer 2, 2A) of a second doping concentration (e.g., C_2, C_2A) and a third epi-layer (e.g., the epi-layer 3, 3A) of a third doping concentration (e.g., C_3, C_3A). The semiconductor substrate and the first epi-layer form a first P-N junction (e.g., the P-N junction 10, 10A) at their interface. The second epi-layer is arranged between the first and third epi-layers, and the second doping concentration is higher than each of the first doping concentration and the third doping concentration.

At step S2, a doped region (e.g., the doped region 8, 8A-8D) of the first conductivity type is formed at a surface of the third epi-layer, such that the doped region and the third epi-layer form a second P-N junction (e.g., the P-N junction 12, 12A-12C) at their interface.

The method may further include one or more of the following optional processing steps:

At step S3, the epitaxial layer and the semiconductor substrate may be selectively etched to form a trench (e.g., the trench 14) extending through the epitaxial layer into the semiconductor substrate.

At step S4, the trench is filled with an electrically insulating material. The electrically insulating material may line the walls (including the sidewalls and the bottom wall) of the trench only, or may fill the entire trench.

At step S5, a further, second, doped region (e.g., the doped region 20) is formed at the surface of the third epi-layer. The second doped region is of the second conductivity type and has a higher doping concentration than the third epi-layer.

At step S6, the epitaxial layer and the semiconductor substrate may be selectively etched to form a further trench (e.g., the trench 24) extending through the epitaxial layer into the semiconductor substrate. The further trench may be surrounded by the trench, and may surround the second doped region. Similarly, the further trench may be filled with an electrically insulating material.

At step S7, a first electrode (e.g., the electrode 18, 18D) is formed to electrically connect to the doped region and a second electrode is formed to electrically connect to the semiconductor substrate. In the event that the second doped region is provided by step S5, the first electrode is also electrically connected to the second doped region.

It would be appreciated that the steps may be performed in a temporal order that is different from the order of description. For example, steps S3 and S4 may be performed before step S2, and/or simultaneously with step S6.

The terms "having", "containing", "including", "comprising" and the like are open and the terms indicate the presence of stated structures, elements or features but not preclude the presence of additional elements or features. The articles "a", "an" and "the" are intended to include the plural as well as the singular, unless the context clearly indicates otherwise.

The skilled person will understand that in the preceding description and appended claims, positional terms such as 'top', 'bottom', 'horizontal', 'vertical', etc. are made with reference to conceptual illustrations of a semiconductor device, such as those showing standard cross-sectional perspectives and those shown in the appended drawings. These terms are used for ease of reference but are not intended to be of limiting nature. These terms are therefore to be understood as referring to a device when in an orientation as shown in the accompanying drawings.

Although the disclosure has been described in terms of preferred embodiments as set forth above, it should be understood that these embodiments are illustrative only and that the claims are not limited to those embodiments. Those skilled in the art will be able to make modifications and alternatives in view of the disclosure which are contemplated as falling within the scope of the appended claims. Each feature disclosed or illustrated in the present specification may be incorporated in the disclosure, whether alone or in any appropriate combination with any other feature disclosed or illustrated herein.

The invention claimed is:

1. A method of manufacturing a semiconductor device, comprising:
depositing an epitaxial layer on a semiconductor substrate, wherein the semiconductor substrate is of a first conductivity type N, and the epitaxial layer is of a second conductivity type P that is opposite to the first conductivity type, wherein depositing the epitaxial layer comprises depositing a first epi-layer of a first doping concentration, a second epi-layer of a second doping concentration and a third epi-layer of a third doping concentration, and wherein: the semiconductor substrate and the first epi-layer form a first P-N junction at their interface; the second epi-layer is arranged between the first and third epi-layers; and the second doping concentration is higher than each of the first doping concentration and the third doping concentration;
forming a first doped region of the first conductivity type N at a surface of the third epi-layer, such that the first doped region and the third epi-layer form a second P-N junction at their interface, wherein the semiconductor substrate, the epitaxial layer and the first doped region form a vertical bipolar junction transistor; and
forming a second doped region of the second conductivity type P at the surface of the third epi-layer, wherein the second doped region is surrounded by the first doped region, and a base of the vertical bipolar junction transistor is shorted to the second doped region.

2. The method of claim 1, further comprising:
selectively etching the epitaxial layer and the semiconductor substrate to form a trench extending through the epitaxial layer into the semiconductor substrate.

3. The method of claim 2, wherein the trench is of a tubular shape.

4. The method of claim 2, further comprising filling the trench with an electrically insulating material.

5. The method of claim 2, wherein the first doped region is separate from the trench without contacting the trench.

6. The method of claim 1, further comprising: forming a first electrode electrically connected to the first doped region and the second doped region, and a second electrode electrically connected to the semiconductor substrate.

7. The method of claim 1, wherein the first doped region occupies less area than the third epi-layer along a plane that is parallel to a surface of the semiconductor substrate.

8. The method of claim 1, wherein the second doped region, the epitaxial layer and the semiconductor substrate form a diode.

9. The method of claim 1, wherein the second doped region has a higher doping concentration than the third epi-layer.

10. The method of claim 1, wherein the semiconductor device is an electrostatic discharge (ESD) protection device.

11. A semiconductor device, comprising:
a semiconductor substrate of a first conductivity type N;
an epitaxial layer arranged on the semiconductor substrate, wherein: the epitaxial layer is of a second conductivity type P that is opposite to the first conductivity type N; the epitaxial layer comprises a first epi-layer of a first doping concentration, a second epi-layer of a second doping concentration and a third epi-layer of a third doping concentration, with the semiconductor substrate and the first epi-layer forming a first P-N junction at their interface; and
the second epi-layer is arranged between the first and third epi-layers and the second doping concentration is higher than each of the first doping concentration and the third doping concentration;
a first doped region arranged at a surface of the third epi-layer, wherein the first doped region is of the first conductivity type N such that the first doped region and the third epi-layer form a second P-N junction at their interface, and wherein the semiconductor substrate, the epitaxial layer and the first doped region form a vertical bipolar junction transistor; and
a second doped region of the second conductivity type P arranged at the surface of the third epi-layer, wherein the second doped region is surrounded by the first doped region, and a base of the vertical bipolar junction transistor is shorted to the second doped region.

12. The semiconductor device of claim 11, wherein the semiconductor device is an electrostatic discharge (ESD) protection device.

13. The semiconductor device of claim 11, further comprising:
a trench extending through the epitaxial layer into the semiconductor substrate.

14. The semiconductor device of claim 13, wherein the trench is of a tubular shape.

15. The semiconductor device of claim 13, wherein the trench is filled with an electrically insulating material.

16. The semiconductor device of claim 13, wherein the first doped region is separate from the trench without contacting the trench.

17. The semiconductor device of claim 13, wherein the semiconductor device is an electrostatic discharge (ESD) protection device.

18. The semiconductor device of claim 11, further comprising:
   a first electrode electrically connected to the first doped region and the second doped region; and
   a second electrode electrically connected to the semiconductor substrate.

19. The semiconductor device of claim 11, wherein the second doped region, the epitaxial layer and the semiconductor substrate form a diode.

20. The semiconductor device of claim 11, wherein the second doped region has a higher doping concentration than the third epi-layer.

* * * * *